United States Patent
Ji et al.

(10) Patent No.: US 9,023,731 B2
(45) Date of Patent: May 5, 2015

(54) CARBON DEPOSITION-ETCH-ASH GAP FILL PROCESS

(71) Applicant: Novellus Systems, Inc., Fremont, CA (US)

(72) Inventors: Chunhai Ji, Portland, OR (US); Sirish Reddy, Hillsboro, OR (US); Tuo Wang, Tianjin (CN); Mandyam Sriram, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 86 days.

(21) Appl. No.: 13/896,729

(22) Filed: May 17, 2013

(65) Prior Publication Data

US 2014/0094035 A1 Apr. 3, 2014

Related U.S. Application Data

(60) Provisional application No. 61/648,979, filed on May 18, 2012.

(51) Int. Cl.
*H01L 21/311* (2006.01)
*H01L 21/033* (2006.01)
(Continued)

(52) U.S. Cl.
CPC ...... *H01L 21/0337* (2013.01); *H01L 21/67069* (2013.01); *H01J 37/32082* (2013.01);
(Continued)

(58) Field of Classification Search
CPC .......... H01L 21/67069; H01L 21/02274; H01L 21/02115; H01L 21/0234; H01L 21/02444; H01L 21/02527; H01L 21/0334; H01L 21/0337; H01L 21/3105; H01L 21/31051; H01L 21/31053; H01L 21/31122; H01L 21/3146

USPC ......... 438/694–697, 699, 702–703, 706–707, 438/710, 712
See application file for complete search history.

(56) References Cited

U.S. PATENT DOCUMENTS

| 3,816,976 A | 6/1974 | Stork et al. |
| 4,209,357 A | 6/1980 | Gorin et al. |

(Continued)

FOREIGN PATENT DOCUMENTS

| FR | 2853313 | 10/2004 |
| JP | 62019539 | 1/1987 |
| JP | 08-152262 | 6/1996 |
| SU | 382671 | 5/1973 |
| WO | WO 2005/048367 | 5/2005 |

OTHER PUBLICATIONS

U.S. Appl. No. 14/185,757, filed Feb. 20, 2014, entitled "PECVD Films for EUV Lithography".

(Continued)

*Primary Examiner* — William F Kraig
*Assistant Examiner* — Sun M Kim
(74) *Attorney, Agent, or Firm* — Weaver Austin Villeneuve & Sampson

(57) ABSTRACT

Techniques, systems, and apparatuses for performing carbon gap-fill in semiconductor wafers are provided. The techniques may include performing deposition-etching operations in a cyclic fashion to fill a gap feature with carbon. A plurality of such deposition-etching cycles may be performed, resulting in a localized build-up of carbon film on the top surface of the semiconductor wafer near the gap feature. An ashing operation may then be performed to preferentially remove the built-up material from the top surface of the semiconductor wafer. Further groups of deposition-etching cycles may then be performed, interspersed with further ashing cycles.

20 Claims, 4 Drawing Sheets

(51) Int. Cl.
   *H01L 21/67* (2006.01)
   *H01J 37/32* (2006.01)
   *H01L 21/02* (2006.01)
   *C23C 16/04* (2006.01)
   *C23C 16/26* (2006.01)

(52) U.S. Cl.
   CPC .... *H01L21/02115* (2013.01); *H01L 21/02274* (2013.01); *H01L 21/31122* (2013.01); *C23C 16/045* (2013.01); *C23C 16/26* (2013.01)

(56) References Cited

U.S. PATENT DOCUMENTS

| | | | |
|---|---|---|---|
| 4,274,841 A | 6/1981 | Andresen et al. | |
| 4,668,261 A | 5/1987 | Chatzipetros et al. | |
| 4,673,589 A | 6/1987 | Standley | |
| 4,863,493 A | 9/1989 | Kotani et al. | |
| 4,863,760 A | 9/1989 | Schantz et al. | |
| 4,975,144 A | 12/1990 | Yamazaki et al. | |
| 5,222,549 A | 6/1993 | Ishii et al. | |
| 5,231,057 A | 7/1993 | Doki et al. | |
| 5,261,250 A | 11/1993 | Missimer | |
| 5,378,316 A | 1/1995 | Franke et al. | |
| 5,470,661 A | 11/1995 | Bailey et al. | |
| 5,562,952 A | 10/1996 | Nakahigashi et al. | |
| 5,670,066 A | 9/1997 | Barnes et al. | |
| 5,792,269 A | 8/1998 | Deacon et al. | |
| 5,900,288 A | 5/1999 | Kuhman et al. | |
| 5,985,103 A | 11/1999 | Givens et al. | |
| 6,006,797 A | 12/1999 | Bulow et al. | |
| 6,030,591 A | 2/2000 | Tom et al. | |
| 6,030,881 A * | 2/2000 | Papasouliotis et al. | 438/695 |
| 6,035,803 A | 3/2000 | Robles et al. | |
| 6,041,734 A | 3/2000 | Raoux et al. | |
| 6,066,209 A | 5/2000 | Sajoto et al. | |
| 6,150,719 A | 11/2000 | Saia et al. | |
| 6,215,087 B1 * | 4/2001 | Akahori et al. | 204/298.02 |
| 6,241,793 B1 | 6/2001 | Lee et al. | |
| 6,286,321 B1 | 9/2001 | Glater | |
| 6,319,299 B1 | 11/2001 | Shih et al. | |
| 6,331,480 B1 | 12/2001 | Tsai et al. | |
| 6,367,413 B1 | 4/2002 | Sill et al. | |
| 6,387,819 B1 | 5/2002 | Yu | |
| 6,458,516 B1 | 10/2002 | Ye et al. | |
| 6,465,051 B1 | 10/2002 | Sahin et al. | |
| 6,478,924 B1 | 11/2002 | Shamouilian et al. | |
| 6,541,397 B1 | 4/2003 | Bencher | |
| 6,573,030 B1 | 6/2003 | Fairbairn et al. | |
| 6,613,434 B1 | 9/2003 | Drevillon et al. | |
| 6,617,553 B2 | 9/2003 | Ho et al. | |
| 6,635,185 B2 | 10/2003 | Demmin et al. | |
| 6,777,349 B2 | 8/2004 | Fu et al. | |
| 6,787,452 B2 | 9/2004 | Sudijono et al. | |
| 6,787,819 B2 | 9/2004 | Rhodes et al. | |
| 6,967,072 B2 | 11/2005 | Latchford et al. | |
| 7,064,078 B2 | 6/2006 | Liu et al. | |
| 7,202,176 B1 | 4/2007 | Goto et al. | |
| 7,205,228 B2 | 4/2007 | Padhi et al. | |
| 7,220,982 B2 | 5/2007 | Campbell | |
| 7,223,526 B2 | 5/2007 | Fairbairn et al. | |
| 7,235,478 B2 | 6/2007 | Geng et al. | |
| 7,288,484 B1 | 10/2007 | Goto et al. | |
| 7,314,506 B2 | 1/2008 | Vininski et al. | |
| 7,323,401 B2 | 1/2008 | Ramaswamy et al. | |
| 7,381,644 B1 | 6/2008 | Subramonium et al. | |
| 7,399,712 B1 | 7/2008 | Graff | |
| 7,495,984 B2 | 2/2009 | Kim et al. | |
| 7,576,009 B2 | 8/2009 | Lee et al. | |
| 7,803,715 B1 | 9/2010 | Haimson et al. | |
| 7,820,556 B2 | 10/2010 | Hsu et al. | |
| 7,915,166 B1 | 3/2011 | Yu et al. | |
| 7,955,990 B2 | 6/2011 | Henri et al. | |
| 7,981,777 B1 | 7/2011 | Subramonium et al. | |
| 7,981,810 B1 | 7/2011 | Subramonium et al. | |
| 8,110,493 B1 | 2/2012 | Subramonium et al. | |
| 8,114,782 B2 | 2/2012 | Graff | |
| 8,129,281 B2 | 3/2012 | Cheung et al. | |
| 8,227,352 B2 | 7/2012 | Yu et al. | |
| 8,309,473 B2 | 11/2012 | Hsu et al. | |
| 8,435,608 B1 | 5/2013 | Subramonium et al. | |
| 8,563,414 B1 | 10/2013 | Fox et al. | |
| 8,569,179 B2 | 10/2013 | Graff | |
| 8,664,124 B2 | 3/2014 | Graff | |
| 8,669,181 B1 | 3/2014 | Yu et al. | |
| 2001/0021491 A1 | 9/2001 | Chen et al. | |
| 2002/0182848 A1 | 12/2002 | Joseph et al. | |
| 2003/0044532 A1 | 3/2003 | Lee et al. | |
| 2003/0106647 A1 | 6/2003 | Koshiishi et al. | |
| 2004/0000534 A1 | 1/2004 | Lipinski | |
| 2004/0016972 A1 | 1/2004 | Singh et al. | |
| 2004/0018750 A1 | 1/2004 | Sophie et al. | |
| 2004/0023502 A1 | 2/2004 | Tzou et al. | |
| 2004/0140506 A1 | 7/2004 | Singh et al. | |
| 2004/0180551 A1 | 9/2004 | Biles et al. | |
| 2004/0224504 A1 | 11/2004 | Gadgil | |
| 2004/0266195 A1 | 12/2004 | Dokumaci et al. | |
| 2005/0042889 A1 | 2/2005 | Lee et al. | |
| 2005/0054202 A1 | 3/2005 | Pan et al. | |
| 2005/0098119 A1 | 5/2005 | Burger et al. | |
| 2005/0112506 A1 | 5/2005 | Czech et al. | |
| 2005/0129935 A1 | 6/2005 | Kunitake et al. | |
| 2005/0130404 A1 | 6/2005 | Moghadam et al. | |
| 2005/0167394 A1 | 8/2005 | Liu et al. | |
| 2005/0202683 A1 | 9/2005 | Wang et al. | |
| 2005/0260411 A1 | 11/2005 | Ravi | |
| 2005/0287771 A1 | 12/2005 | Seamons et al. | |
| 2006/0019486 A1 | 1/2006 | Yu et al. | |
| 2006/0091559 A1 | 5/2006 | Nguyen et al. | |
| 2006/0154086 A1 | 7/2006 | Fuller et al. | |
| 2006/0154477 A1 | 7/2006 | Geng et al. | |
| 2006/0197881 A1 | 9/2006 | Kang et al. | |
| 2006/0205223 A1 | 9/2006 | Smayling | |
| 2006/0231524 A1 | 10/2006 | Liu et al. | |
| 2007/0032054 A1 | 2/2007 | Ramaswamy et al. | |
| 2007/0048674 A1 | 3/2007 | Wells | |
| 2007/0054500 A1 | 3/2007 | Bencher | |
| 2007/0059913 A1 | 3/2007 | King et al. | |
| 2007/0077780 A1 | 4/2007 | Wang et al. | |
| 2007/0105303 A1 | 5/2007 | Busch et al. | |
| 2007/0125762 A1 | 6/2007 | Cui et al. | |
| 2007/0128538 A1 | 6/2007 | Fairbairn et al. | |
| 2007/0140029 A1 | 6/2007 | Kim et al. | |
| 2007/0166546 A1 | 7/2007 | Ichikawa et al. | |
| 2007/0166979 A1 | 7/2007 | Wang et al. | |
| 2007/0202640 A1 | 8/2007 | Al-Bayati et al. | |
| 2007/0247073 A1 | 10/2007 | Paterson et al. | |
| 2008/0073636 A1 | 3/2008 | Kim | |
| 2008/0083916 A1 | 4/2008 | Kim | |
| 2008/0128907 A1 | 6/2008 | Yang et al. | |
| 2008/0200003 A1 | 8/2008 | Hong et al. | |
| 2008/0242912 A1 | 10/2008 | Letessier et al. | |
| 2008/0254639 A1 | 10/2008 | Graff | |
| 2008/0254641 A1 | 10/2008 | Kobayashi et al. | |
| 2008/0264803 A1 | 10/2008 | Agrawal | |
| 2009/0182180 A1 | 7/2009 | Huang et al. | |
| 2009/0305516 A1 | 12/2009 | Hsu et al. | |
| 2010/0151691 A1 | 6/2010 | Henri et al. | |
| 2010/0297853 A1 | 11/2010 | Hsu et al. | |
| 2011/0151678 A1 * | 6/2011 | Ashtiani et al. | 438/786 |
| 2011/0244142 A1 | 10/2011 | Cheng et al. | |
| 2012/0149207 A1 | 6/2012 | Graff | |
| 2012/0196446 A1 | 8/2012 | Graff | |
| 2014/0057454 A1 | 2/2014 | Subramonium et al. | |
| 2014/0094035 A1 | 4/2014 | Ji et al. | |
| 2014/0170853 A1 | 6/2014 | Shamma et al. | |

OTHER PUBLICATIONS

U.S. Appl. No. 14/270,001, filed May 5, 2014, entitled "Sulfur Doped Carbon Hard Masks."

U.S. Appl. No. 14/248,046, filed Apr. 8, 2014, entitled High Selectivity and Low Stress Carbon Hardmask by Pulsed Low Frequency RF Power.

(56) References Cited

OTHER PUBLICATIONS

U.S. Appl. No. 13/160,399, filed Jun. 14, 2011, entitled "Methods of Depositing Highly Selective Transparent Ashable Hardmask Films".
U.S. Appl. No. 11/612,382, filed Dec. 18, 2006, entitled "Methods of Improving Ashable Hardmask Adhesion to Metal layers".
U.S. Appl. No. 11/849,208, filed Aug. 31, 2007, entitled "Methods and Apparatus for Plasma-Based Deposition".
U.S. Appl. No. 13/856,364, filed Apr. 3, 2013, entitled "Methods of Depositing Smooth and Conformal Ashable Hard Mask Films".
US Notice of Allowance, dated Oct. 4, 2006, issued in U.S. Appl. No. 11/318,269.
US Office Action, dated Dec. 14, 2006, issued in U.S. Appl. No. 11/318,269.
US Notice of Allowance, dated May 7, 2007, issued in U.S. Appl. No. 11/318,269.
US Office Action, dated Aug. 27, 2007, issued in U.S. Appl. No. 11/318,269.
US Notice of Allowance, dated Jan. 7, 2008, issued in U.S. Appl. No. 11/318,269.
US Office Action, dated Nov. 22, 2010, issued in U.S. Appl. No. 12/048,967.
US Office Action, dated Apr. 18, 2011, issued in U.S. Appl. No. 12/048,967.
US Notice of Allowance, dated Oct. 7, 2011, issued in U.S. Appl. No. 12/048,967.
US Office Action dated, Dec. 27, 2007, issued in U.S. Appl. No. 11/449,983.
US Final Office Action, dated Jul. 9, 2008, issued in U.S. Appl. No. 11/449,983.
US Office Action, dated Jan. 5, 2009, issued in U.S. Appl. No. 11/449,983.
US Final Office Action, dated Sep. 15, 2009, issued in U.S. Appl. No. 11/449,983.
US Office Action, dated Jun. 21, 2010, issued in U.S. Appl. No. 11/449,983.
US Final Office Action, dated Dec. 30, 2010, issued in U.S. Appl. No. 11/449,983.
US Notice of Allowance, dated Mar. 16, 2011, issued in U.S. Appl. No. 11/449,983.
US Office Action, dated Jun. 1, 2007, issued in U.S. Appl. No. 11/612,382.
US Office Action, dated Oct. 9, 2007, issued in U.S. Appl. No. 11/612,382.
US Final Office Action, dated May 13, 2008, issued in U.S. Appl. No. 11/612,382.
US Office Action, dated Aug. 19, 2008, issued in U.S. Appl. No. 11/612,382.
US Final Office Action, dated Feb. 24, 2009, issued in U.S. Appl. No. 11/612,382.
US Final Office Action, dated May 12, 2009, issued in U.S. Appl. No. 11/612,382.
US Final Office Action, dated Dec. 9, 2009, issued in U.S. Appl. No. 11/612,382.
US Office Action, dated Mar. 26, 2010, issued in U.S. Appl. No. 11/612,382.
US Office Action dated Nov. 20, 2009, issued in U.S. Appl. No. 11/710,652.
US Final Office Action dated Apr. 15, 2010, issued in U.S. Appl. No. 11/710,652.
US Office Action dated Aug. 5, 2010, issued in U.S. Appl. No. 11/710,652.
US Notice of Allowance dated Nov. 24, 2010, issued in U.S. Appl. No. 11/710,652.
US Office Action dated Jul. 9, 2013, issued in U.S. Appl. No. 13/032,392.
US Notice of Allowance dated Oct. 25, 2013, issued in U.S. Appl. No. 13/032,392.
US Office Action, dated Jan. 5, 2009, issued in U.S. Appl. No. 11/710,377.
US Office Action, dated Aug. 19, 2009, issued in U.S. Appl. No. 11/710,377.
US Office Action, dated Mar. 31, 2010, issued in U.S. Appl. No. 11/710,377.
US Notice of Allowance, dated Mar. 22, 2011, issued in U.S. Appl. No. 11/710,377.
US Office Action, dated Sep. 3, 2010, issued in U.S. Appl. No. 11/849,208.
US Final Office Action, dated Apr. 12, 2011, issued in U.S. Appl. No. 11/849,208.
US Final Office Action, dated Sep. 14, 2012, issued in U.S. Appl. No. 11/849,208.
US Final Office Action, dated Apr. 24, 2013, issued in U.S. Appl. No. 11/849,208.
US Office Action, dated Feb. 28, 2014, issued in U.S. Appl. No. 13/974,808.
US Office Action, dated Oct. 19, 2011, issued in U.S. Appl. No. 12/163,670.
US Office Action, dated Feb. 14, 2012, issued in U.S. Appl. No. 12/163,670.
US Office Action, dated Jul. 6, 2012, issued in U.S. Appl. No. 12/163,670.
US Final Office Action dated Oct. 18, 2012, issued in U.S. Appl. No. 12/163,670.
US Notice of Allowance dated Jan. 3, 2013, issued in U.S. Appl. No. 12/163,670.
US Notice of Allowance, dated Nov. 2, 2010, issued in U.S. Appl. No. 12/334,220.
US Supplemental Notice of Allowance, dated Feb. 8, 2011, issued in U.S. Appl. No. 12/334,220.
US Office Action, dated Aug. 19, 2009, issued in U.S. Appl. No. 12/133,223.
US Final Office Action, dated Dec. 21, 2009, issued in U.S. Appl. No. 12/133,223.
US Notice of Allowance, dated Mar. 2, 2010, issued in U.S. Appl. No. 12/133,223.
US Office Action, dated Nov. 9, 2011, issued in U.S. Appl. No. 12/786,842.
US Final Office Action, dated Apr. 19, 2012, issued in U.S. Appl. No. 12/786,842.
US Notice of Allowance, dated Jul. 20, 2012, issued in U.S. Appl. No. 12/786,842.
US Office Action, dated Aug. 10, 2012, issued in U.S. Appl. No. 12/766,721.
US Final Office Action, dated Mar. 14, 2013, issued in U.S. Appl. No. 12/766,721.
US Notice of Allowance, dated Jun. 28, 2013, issued in U.S. Appl. No. 12/766,721.
US Office Action, dated Jun. 1, 2007, issued in U.S. Appl. No. 11/263,148.
US Final Office Action, dated Oct. 24, 2007, issued in U.S. Appl. No. 11/263,148.
US Notice of Allowance, dated Mar. 18, 2008, issued in U.S. Appl. No. 11/263,148.
US Office Action, dated May 2, 2011, issued in U.S. Appl. No. 11/263,148.
US Notice of Allowance, dated Oct. 13, 2011, issued in U.S. Appl. No. 11/263,148.
US Office Action, dated Feb. 15, 2013, issued in U.S. Appl. No. 13/371,184.
US Notice of Allowance, dated Jul. 1, 2013, issued in U.S. Appl. No. 13/371,184.
US Office Action, dated Oct. 9, 2013, issued in U.S. Appl. No. 13/372,363.
US Notice of Allowance, dated Dec. 30, 2013, issued in U.S. Appl. No. 13/372,363.
Korean Office Action, dated Jun. 1, 2010, issued in Application No. 2009/0048358.
Callegari et al. (1993) "Optical properties of hydrogenated amorphous-carbon film for attenuated phase-shift mask applications," *J. Vac. Sci. Technol. B* 11(6):2697-2699.
Grill, A. (1999) "Diamond-like carbon: state of the art," *Diamond and Related Materials* 8, pp. 428-434.

(56) References Cited

OTHER PUBLICATIONS

Grill, A. (1999) "Plasma-deposited diamondlike carbon and related materials," IBM Journal of Research and Development, vol. 43, ½'A, http://research.ibm.com/journal/rd/431/grill.html.,14 pp.

Grill, et al. (1990) "Diamondlike carbon films by rf plasma-assisted chemical vapor deposition from acetylene," *IBM J. Res. Develop.*, 34(6):849-857.

Holmes et al. (1987) "Trimethylsilylacetylene", *Organic Syntheses, Coll.* vol. 8, p. 606; vol. 65, p. 61.

Ikeda et al. (1992) "Top-PECVD": A New Conformal Plasma Enhanced CVD Technology using TEOS, Ozone and Pulse-modulated RF Plasma, IEEE, pp. 11.2.1-11.2.4.

Jacobsohn et al. (1998) "Hydrogenated Carbon-Nitrogen Films Obtained by PECVD Using Acetylyne and Nitrogen As Precursor Gases," Mat. Res. Soc. Symp. Proc., 498: 283-288.

Kragler et al. (1995) "Scanning tunneling microscopy based lithography employing amorphous hydrogenated carbon as a high resolution resist mask," *Appl. Phys. Lett.* 67(8):1163-1165.

Kreupl, Franz et al. (2008) "Carbon-Based Resistive Memory," presented at *IEDM*, submitted Jun. 26, 2008; accepted Aug. 4, 2008, 4 pages.

Lemaire, P.J., Walker, K.L., Kranz, K.S., Huff, R.G. and DiMarcello, F.V. "Diffusion of Hydrogen Through Hermetic Carbon Films on Silica Fibers," AT&T Bell Laboratories, 600 Mountain Avenue, Murray Hill, NJ 07974. *Mat. Res. Soc. Symp. Proc.*, 172:85-96 © 1990 Materials Research Society.

Muhl et al. (1999) "A Review of the Preparation of Carbon Nitride Films," Diamond and Related Materials, 8: 1809-1830.

Ong, Soon-Eng et al. (2007) "Temperature effect on bonding structures of amorphous carbon containing more than 30at.% silicon," *Diamond & Related Materials*, 16:1823-1827.

van de Ven et al. (1990) "Advantages of Dual Frequency PECVD for Deposition of ILD and Passivation Films," VLSI Multilevel Interconnection Conference Proceedings, Seventh International IEEE, 194-201.

Voronkin et al. (1994) "Structure and mechanical properties of a-C:H films deposited onto polymer substrates: Diamond and Related Materials," 4:5-9.

* cited by examiner

US 9,023,731 B2

CARBON DEPOSITION-ETCH-ASH GAP FILL PROCESS

CROSS REFERENCE TO RELATED APPLICATION

This application claims benefit under 35 U.S.C. §119(e) to U.S. Provisional Application No. 61/648,979, filed May 18, 2012, titled "CARBON DEPOSITION-ETCH-ASH GAP FILL PROCESS," which is hereby incorporated by reference herein in its entirety.

BACKGROUND

Amorphous carbon films have been used in semiconductor processing to provide hardmasks to transfer feature patterns to a substrate for etch processes. Such carbon films are typically deposited using spin coating or PECVD coating.

Recently, amorphous carbon has been used to provide gap fill for gap features during semiconductor processing operations. Such carbon gap-fill films may be used, for example, as a sacrificial layer in logic/memory semiconductor device fabrication.

Such gap fill may be provided using spin coating techniques or by plasma-enhanced chemical vapor deposition (PECVD) techniques such as those used to provide hardmasks. Spin-on coating techniques, however, can provide poor mechanical properties that yield bad chemical-mechanical planarization results and prevent or hinder process integration. In contrast, PECVD deposited carbon films normally have good overall film properties, but large voids are typically formed in trench-like gap features due to poor gap-fill capability.

SUMMARY

In some implementations, a method may be provided in which (a) a substrate is provided in a semiconductor process chamber. The substrate may have a top surface and at least one gap feature with a gap entry width where the at least one gap feature intersects the top surface. The method may further include (b) performing a deposition process to deposit a carbon film layer on the substrate and on exposed surfaces of the at least one gap feature. The deposition process may be performed at least until the deposited carbon film layer causes the gap entry width to be reduced. The method may further include (c) performing an anisotropic etch process on the substrate with a dominant anisotropic axis substantially perpendicular to the substrate at least until the gap entry width increases from the gap entry width at the conclusion of (b). The method may also include (d) performing X additional cycles of (b) and (c), wherein X is a positive integer, and then (e) performing an ashing process to remove localized build-up of carbon film on the top surface of the substrate adjacent to the at least one gap feature produced as a result of (b) through (d).

In some further implementations, the method may also include (f) performing Y additional cycles of (a) through (e), wherein Y is a positive integer.

In some implementations, the at least one gap feature may have a gap feature depth of Z Å, and Y may be between $$\frac{Z}{75 \mathring{A}}$$

and $$\frac{Z}{40 \mathring{A}}.$$

In some implementations, X may be between about 1 and 100, and Y may be between about 2 and 1000. In some implementations, X may be between about 2 and 20, and Y may be between about 10 to 100.

In some implementations, the at least one gap feature may have a depth-to-width aspect ratio of up to about 12:1 and the gap entry width may be between about 30 nm and about 140 nm.

In some implementations, the deposition process may be a plasma-enhanced chemical vapor deposition (PECVD) process. In some further such implementations, the PECVD process may use a $C_XH_Y$ precursor. In yet some further such implementations, the $C_XH_Y$ precursor may be $C_2H_2$.

In some implementations, the anisotropic etch process may be a plasma etch process with a high ion sputtering regime as compared with the ashing process. In some further such implementations, the anisotropic etch process may use an etch chemistry that includes $H_2$ and Ar.

In some implementations, the ashing process may be performed under conditions that cause the ashing process to preferentially remove the localized build-up of carbon film on the top surface of the substrate adjacent to the at least one gap feature produced as a result of (b) through (d).

In some implementations, (a) through (e) may be performed in a single chamber without performing an intervening vacuum break.

In some implementations, the deposition process may last from between about 0.5 s to about 30 s and be performed under pressure conditions of between about 0.025 Torr to about 8 Torr and at a temperature of between about 400 to about 500° C., may include providing $C_XH_Y$ gas to a reaction area above the substrate at a flow rate of between about 100 sccm to about 9500 sccm, $H_2$ gas to the reaction area at a flow rate of between about 100 sccm to about 9500 sccm, and may include supplying high-frequency radio-frequency power of between about 100 W to about 3000 W and low-frequency radio-frequency power of between about 200 W to about 5000 W. In such implementations, the anisotropic etch process may last from between about 0.5 s to about 30 s and be performed under pressure conditions of between about 0.025 Torr to about 1 Torr and at a temperature of between about 400 to about 500° C., may include providing $H_2$ gas to the reaction area at a flow rate of between about 100 sccm to about 2000 sccm, and may include supplying high-frequency radio-frequency power of between about 100 W to about 1500 W and low-frequency radio-frequency power of between about 200 W to about 5000 W. Additionally, in such implementations the ashing process may last from between about 0.5 s to about 30 s and be performed under pressure conditions of between about 4 Torr to about 8 Torr and at a temperature of between about 400 to about 500° C., may include providing $H_2$ gas to the reaction area at a flow rate of between about 5000 sccm to about 9500 sccm, and may include supplying high-frequency radio-frequency power of between about 1500 W to about 3000 W. The flow rate of $C_XH_Y$ during the anisotropic etch process and the ashing process in such implementations may be at or about 0 sccm.

In some such implementations, at least one of the deposition process, the anisotropic etching process, and the ashing process may further include one or more operations selected from the group consisting of: supplying He gas to the reaction area at a flow rate of up to about 9500 sccm, supplying $N_2$ gas to the reaction area at a flow rate of up to about 9500 sccm, and supplying Ar gas to the reaction area at a flow rate of up to about 9500 sccm.

In some further such implementations, the ashing process may further include supplying low-frequency radio-frequency power of up to about 5000 W. In some implementations, the $C_XH_Y$ gas may be $C_2H_2$.

In some implementations, the deposition process may last approximately 3 s and be performed under pressure conditions of approximately 0.5 Torr at 450° C., and may include providing $C_XH_Y$ gas to a reaction area above the substrate at a flow rate of approximately 300 sccm, $H_2$ gas to the reaction area at a flow rate of approximately 200 sccm, and Ar gas to the reaction area at a flow rate of approximately 2000 sccm. In such implementations, the deposition process may also include supplying high-frequency radio-frequency power of approximately 400 W and low-frequency radio-frequency power of approximately 2400 W. Such implementations may also include an anisotropic etch process that may last approximately 9 s and be performed under pressure conditions of approximately 0.3 Torr and 450° C., and may include providing $H_2$ gas to the reaction area at a flow rate of approximately 400 sccm and Ar gas to the reaction area at a flow rate of approximately 5600 sccm. In such implementations, the etching process may also include supplying high-frequency radio-frequency power of approximately 1000 W and low-frequency radio-frequency power of approximately 2000 W. Such implementations may also include an ashing process that may last approximately 15 s and be performed under pressure conditions of approximately 6 Torr and 450° C., and may include providing Ar gas to the reaction area at a flow rate of approximately 5000 sccm and supplying high-frequency radio-frequency power of approximately 3000 W. In some such implementations, the $C_XH_Y$ gas is $C_2H_2$.

In some alternative implementations, a method may be provided that includes (a) providing a substrate in a semiconductor process chamber, the substrate having a top surface and at least one gap feature with a gap entry width where the at least one gap feature intersects the top surface, (b) performing a deposition process to deposit a carbon film layer on the substrate and on exposed surfaces of the at least one gap feature, wherein the deposition process is performed at least until the deposited carbon film layer causes the gap entry width to be reduced, and (c) performing an anisotropic etch process on the substrate at least until the gap entry width increases from the gap entry width at the conclusion of (b).

In some other alternative implementations, a method may be provided that includes (a) providing a substrate in a semiconductor process chamber, the substrate having a top surface and at least one gap feature with a gap entry width where the at least one gap feature intersects the top surface, (b) performing a deposition process to deposit a carbon film layer on the substrate and on exposed surfaces of the at least one gap feature, wherein the deposition process is performed at least until the deposited carbon film layer causes the gap entry width to be reduced, and (c) performing an ashing process to remove localized build-up of carbon film on the top surface of the substrate adjacent to the at least one gap feature produced as a result of (b).

In either such alternative implementation, the methods may further include (d) performing X additional cycles of (b) and (c), wherein X is a positive integer.

In some implementations, a semiconductor processing tool may be provided. The semiconductor processing tool may include a process chamber, one or more gas inlets into the process chamber and associated flow-control hardware, a low-frequency radio-frequency (LFRF) generator, a high-frequency radio-frequency (HFRF) generator, and a controller having at least one processor and a memory. The at least one processor and the memory may be communicatively connected with one another, and the at least one processor may at least be operatively connected with the flow-control hardware, the HFRF generator, and the LFRF generator. The memory may store computer-executable instructions for controlling the at least one processor to at least control the flow-control hardware, the HFRF generator, and the LFRF generator to: (a) perform a deposition process on a substrate having a top surface and at least one gap feature with a gap entry width where the at least one gap feature intersects the top surface to deposit a carbon film layer on the substrate and on exposed surfaces of the at least one gap feature, where the deposition process is performed at least until the deposited carbon film layer causes the gap entry width to be reduced, (b) perform an anisotropic etch process on the substrate with a dominant anisotropic axis substantially perpendicular to the substrate at least until the gap entry width increases from the gap entry width at the conclusion of (a), (c) perform X additional cycles of (a) and (b), wherein X is a positive integer, and (d) perform an ashing process to remove localized build-up of carbon film on the top surface of the substrate adjacent to the at least one gap feature produced as a result of (a) through (c).

In some such implementations, the computer-executable instructions may further include instructions for controlling the at least one processor to at least control the flow-control hardware, the HFRF generator, and the LFRF generator to e) perform Y additional cycles of (a) through (d), wherein Y is a positive integer.

DETAILED DESCRIPTION

Figure 1:
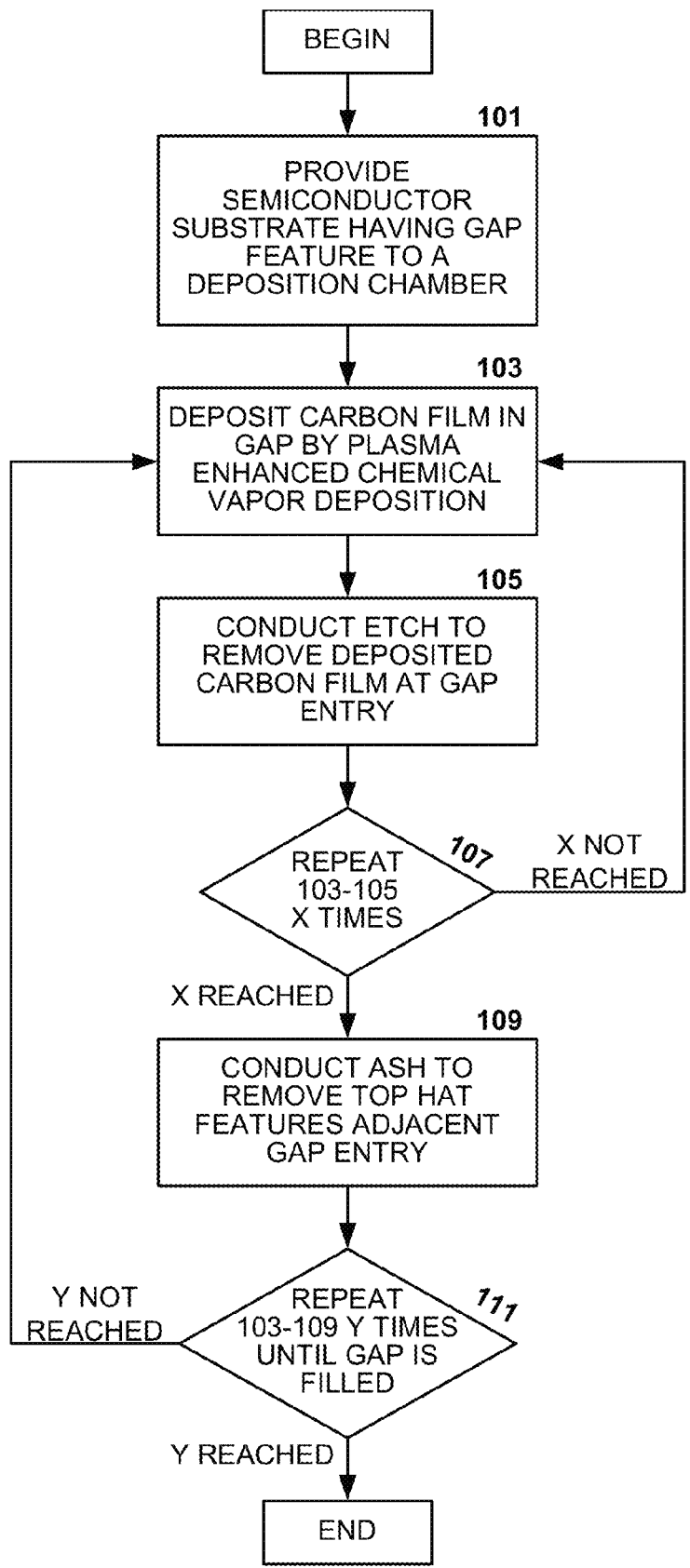
FIG. 1 depicts a process flow diagram illustrating major operations in one implementation of a technique for depositing a carbon film for gap-fill purposes.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

It is to be understood that the variables "X" and "Y" are used herein in two different capacities that are not linked to one another. In the context of a molecular formula, these variables indicate the quantity of various atoms within the molecule, e.g., in $C_XH_Y$, values of X=2 and Y=2 would yield $C_2H_2$. In the context of process cycle repetitions, such numbers indicate the number of respective process cycles that are performed. Thus, if $C_2H_2$ is used as a $C_XH_Y$ gas in a given process, the fact that X=2 and Y=2 for this gas in this process does not require that X=2 and Y=2 with respect to the number of process cycle repetitions for this process as described below.

Disclosed herein are various new techniques that may be conducted on a PECVD platform that allow for filling of high aspect ratio gap features, e.g., having aspect ratios up to 12:1 and gap width of 30 nm or less, by amorphous carbon material with reduced or minimal voids as compared to other PECVD techniques. The techniques described herein are applicable in a variety of contexts, but will be principally described in a semiconductor processing context.

In one such technique, an alternated {{Deposition+Etching}$_X$+Ashing}$_Y$ process may be implemented on a PECVD platform, such as a Vector™ or Sequel™ tool available from Lam Research Corp., to deposit a carbon film onto a substrate having a gap feature, e.g., a trench. The substrate may have additional gap features and these additional gap features may be subject to the same processing steps discussed herein and may thus also benefit from the described technique.

Deposition into the trench may be conducted until the trench opening is reduced, e.g., closed or narrowed to the point that continued deposition in the trench is unacceptably slowed, due to top deposition. The process may then be switched to an anisotropic etch process, and following that, to an ashing process. The general process operations of such a technique may include, for example: (a) a PECVD deposition regime in which a carbon film is deposited into a gap feature until deposition in the gap is unacceptably slowed or stopped due to closing of the entry to the gap feature (top) by deposited carbon at the top of the gap; (b) a high ion sputtering regime, in which carbon film is removed from the gap entry by an etch chemistry that includes $H_2$ and Ar to reopen the gap for further film deposition, (c) a third regime in which the etch process conditions are adjusted to effect an ash process that is used to preferentially remove carbon accumulation on the top of the gap substrate surface adjacent to the gap entry, commonly referred to as "top hats." The ash operation (c) may follow a plurality of cycles of the deposition (a) and etch (b) operations. All three operations may then be repeated again in the same or a similar cycle to incrementally fill the gap.

In other embodiments, ashing may precede etching in the cycle of operations.

Etch/ash process optimization may be done to find a balance between sputtering and clipping of the underlying feature in the initial etch process to remove carbon from the gap entry. Optimization of the ash process may be done to minimize the effect of activity of ashing chemistry in the bottom of trench. Given the disclosure provided herein, one skilled in the art would be able to perform these optimizations without further guidance.

The process may be implemented on a planar PECVD platform such that the deposition-etch-ash cycles are performed in one process path without a vacuum break. As described in further detail below, a chemical-physical combined etch may be used to preferentially remove film deposited at trench top, but with less etching of the film deposited in the trench.

PECVD platform implementation has the further advantage of being less costly than high density plasma (HDP) gap-fill platforms.

FIG. 1 is a process flow diagram illustrating major operations in one implementation of a technique for depositing a carbon film for gap-fill purposes. Simplified cross-sectional views of a gap feature during various stages of such a technique are also illustrated in FIGS. 2A-2F. Elements in both FIG. 1 and FIGS. 2A-2F are referenced in the following discussion. While FIG. 1 depicts both "begin" and "end" blocks, it is to be understood that other processes may precede or follow the operations shown, and that the "begin" and "end" blocks do not preclude such other implementations. In block 101, a substrate 201 having a gap feature 203 to be filled is provided to a deposition chamber, e.g., a PECVD chamber. The gap feature 203 may be of a size typically encountered or anticipated in current or future semiconductor processing operations, including narrow, high aspect ratio trenches (e.g., depth/width aspect ratio of 12:1, trench width=30 nm) and lower aspect ratio wider trenches (e.g., depth/width aspect ratio of 2:1, trench width=140 nm). The substrate surface may be a metal, a dielectric, or a semiconductor material, but may most typically be a semiconductor material, such as silicon.

A carbon film 205 may then be deposited in the gap 203 using a PECVD (103) process. In this regard, a process gas containing a precursor for the film to be deposited in the gap is introduced into the chamber. Any suitable $C_XH_Y$ precursor, such as are used in amorphous carbon and ashable hard mask deposition processes, may be used. A specific example preferred in many implementations is acetylene ($C_2H_2$), although other precursors may also be used to good effect. Typically the process gas contains only one type of hydrocarbon precursor. Other process gases may include hydrogen, as well as nitrogen, helium, argon, or other inert gases. A plasma may be ignited in these process gases using a radio frequency source and a carbon film may then be deposited in the gap by the resulting plasma enhanced chemical vapor deposition process.

Figure 2A:
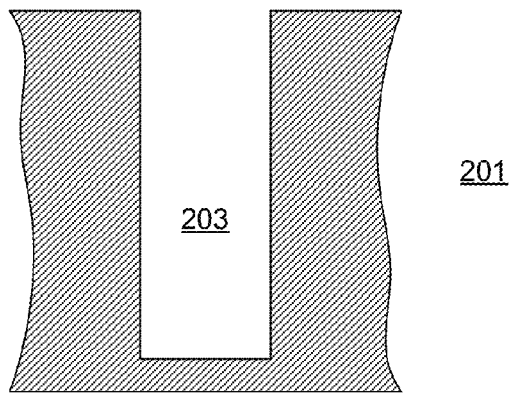
FIGS. 2A-2F depict simplified cross-sectional views of a gap feature during various stages of a technique for depositing a carbon film for gap-fill purposes.
Figure 2B:
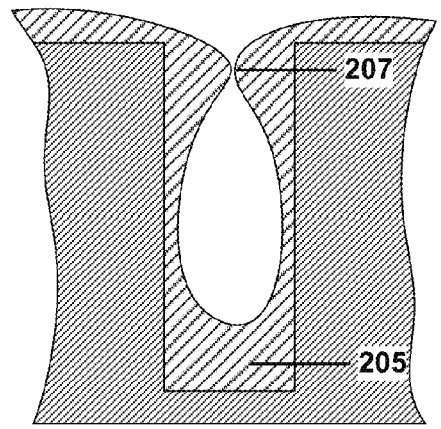

The deposition process of block 103 may be conducted until the trench opening is closed or narrowed to the point that continued deposition in the trench is unacceptably slowed due to top deposition, as indicated at 207 of FIG. 2B. For example, the deposition rate for a deposition cycle may be unacceptably slowed when the deposition rate decreases to approximately 40-60% of the deposition rate at the start of the deposition cycle. In other implementations, there may be more or less decrease in deposition rate.

Figure 2C:
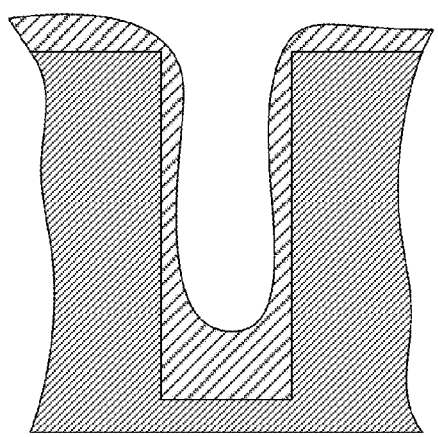

In block 105, an anisotropic etch operation may be performed to remove deposited carbon film at the gap entry. The anisotropic etch operation may be a plasma etch featuring a high ion sputtering regime in which carbon film is removed from the gap entry by an etch chemistry that includes $H_2$ and Ar, thus reopening the gap for further film deposition. The reopened gap, as illustrated in FIG. 2C, allows for further gap fill of the gap feature. The etch operation may be performed for a given duration, e.g., a duration that is associated with sufficient carbon film removal to cause the gap to generally be reopened to the point where the gap entry is slightly undercut. In some implementations, the gap entry may be reopened to a lesser degree. In some other implementations, the etch operation may be performed until the carbon film on the top surface of the substrate is completely, or nearly completely removed, and then stopped. This may prevent the etch process from also removing the substrate material in addition to the overlying carbon film.

A high ion sputtering regime may, for example, be provided by a process environment including a high flow of Ar gas, a high level of low-frequency radio-frequency (LFRF) power, and a high pressure as compared to a low ion sputtering regime, which may feature low Ar gas flow, a low level of LFRF power, and a low pressure.

In block 107, the deposition and etch operations of blocks 103 and 105 may be repeated a plurality of times (X) to continue filling of the gap. In various embodiments, X may range from about 1 to 100, 2 to 20, 3 to 11, or to an integer value in between.

Figure 2D:
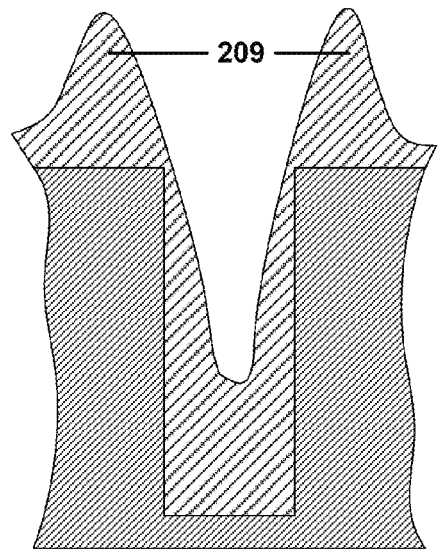
Figure 2E:
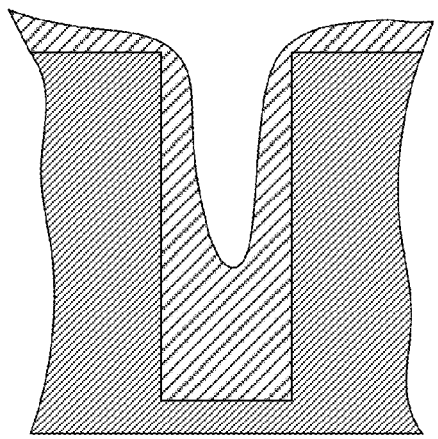

After a number of deposition and etch cycles, typically 2-15 in many implementations, for example 5, a carbon film accumulation on the top of the gap substrate surface adjacent to the gap entry, commonly referred to as "top hat" features 209, forms, as illustrated in FIG. 2D. The top hats may then be removed by conducting an ashing operation in block 109 with process conditions adjusted to preferentially remove the top hat carbon accumulation on the top surface of the substrate adjacent to the gap entry, as illustrated in FIG. 2E.

While etching and ashing operations may both be used to remove material from a substrate, the mechanisms by which they operate are distinct.

In plasma etching processes such as high ion sputtering regime etching, the etching process is largely anisotropic. In such processes, ions are created, for example, by exposing a gas such as Ar or $H_2$ to a high-frequency radio frequency (HFRF) electromagnetic field to produce a plasma; this may be done within the process chamber or remotely (other techniques, e.g., microwave techniques, may also be used to produce the ions). These ions are then accelerated towards a wafer (or substrate) by a bias voltage that is created by an LFRF electromagnetic field produced between two electrodes bracketing the wafer. The ions travel towards the wafer in directions largely perpendicular to the wafer due to the bias voltage and gain energy as they accelerate. Upon reaching the wafer, the ions may collide with molecules or atoms within or on the wafer, e.g., carbon atoms that were deposited on the wafer in a previous deposition cycle. In doing so, a momentum transfer between the high-energy ions and the impacted atoms/molecules may cause the impacted atoms/molecules to be knocked free of the wafer. Thus, the mechanism for material removal in an anisotropic etch operation having a high ion sputtering regime is primarily a physical mechanism, i.e., material is removed due to momentum transfer and such material removal is more concentrated on surfaces that are perpendicular to the average velocity vector of the energetic ions than on surfaces that are parallel to such a velocity vector. As a result, material is generally removed at a faster rate in directions parallel to the average velocity vector of the ions. The phrase "dominant anisotropic axis" may be used to refer to the axis along which anisotropic behavior, e.g., etch rate, is greatest.

In contrast, ashing processes are typically more isotropic in nature since they are largely dependent on chemical interactions for material removal rather than on the directional movement of energetic ions. For example, any surface that is exposed to the process gas used in an ashing operation may experience material removal due to the exposure. Additionally, in contrast to some chemical etching processes, ashing operations may produce a reaction product that is completely in the gas phase. Accordingly, ashing operations may not produce particulate byproducts that may contaminate a wafer as may be the case with other types of chemical material removal processes. Ashing operations for carbon films may, for example, utilize dissociated $H_2$ or $O_2$ as a process gas, which may react with carbon films to form such gas-phase reaction byproducts.

As discussed above, the ashing operations may preferentially remove the accumulated carbon film around the edges of the gap feature, e.g., the "top hat" features, over the carbon film deposited in the trench features. This is largely due to the substantially isotropic nature of the ashing operations—the top hat features have a high exposed-surface-area-to-volume ratio compared with the exposed-surface-area-to-volume ratio of the filled gap features. As a result, the top hat features experience a higher rate of chemical reaction with the disassociated ashing gases than the carbon-filled gap features do. Accordingly, the top hat features are reacted into gas phase byproducts at a much greater rate than the gap fill features are.

Figure 2F:
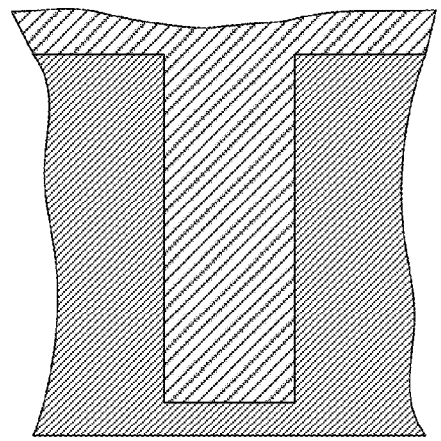

In block 111, the operations of blocks 103, 105, 107 and 109 are repeated Y times until the gap is filled, as illustrated in FIG. 2F. In some implementations, the operations of blocks 103, 105, 107, and 109 may be repeated using the same process parameters for each such repetition. In other implementations, however, the operations of blocks 103, 105, 107, and 109 may be repeated using the different process parameters for at least one of the repetitions.

Operations 103, 105, 107, and 109 may be repeated at least once, although the number of repetitions may range widely (e.g., Y=2 to 1000). Typically Y may range from about 10 to 100, or from 30 to 60, or any integer value in between, for example 40 or 55 times, depending upon gap height and other considerations. In one example, Y=55 was found to be suitable for a 3000 Å deep gap feature having a depth/width aspect ratio of approximately 12:1.

The above-described process may be described by the following relation:

$$\{\{\text{Deposition}+\text{Etching}\}_X+\text{Ashing}\}_Y$$

Suitable process parameters for the technique described above are presented in the following tables. Table 1 provides general ranges of process parameters that may be suitable for various implementations of the technique described above.

TABLE 1

|  | Operation | Deposition | Etching | Ashing |
| --- | --- | --- | --- | --- |
| Conditions | Time (s) | 0.5-30 | 0.5-30 | 0.5-30 |
|  | Pressure (Torr) | 0.025 to 8 | 0.025 to 1 | 4 to 8 |
|  | Temperature (° C.) | 400 to 500 | 400 to 500 | 400 to 500 |
| Deposition Precursor | $C_xH_y$ Flow (sccm) | 100 to 9500 | 0 | 0 |
| Process Gas | $H_2$ Flow (sccm) | 100 to 9500 | 100 to 2000 | 5000 to 9500 |
| Inert Carrier Gases | He Flow (sccm) | 0 to 9500 | 0 to 9500 | 0 to 9500 |
|  | $N_2$ Flow (sccm) | 0 to 9500 | 0 to 9500 | 0 to 9500 |
|  | Ar Flow (sccm) | 0 to 9500 | 0 to 9500 | 0 to 9500 |

TABLE 1-continued

| | Operation | Deposition | Etching | Ashing |
|---|---|---|---|---|
| Plasma Excitation | High-frequency Radio-frequency (HFRF) Generator Setpoint (W) | 100 to 3000 | 100 to 1500 | 1500 to 3000 |
| | Low-frequency Radio-frequency (LFRF) Generator Setpoint (W) | 200 to 5000 | 200 to 5000 | 0 to 1000 |

Table 2 provides parameters for a specific example of suitable deposition-etch-ash process conditions in accordance with a particular implementation of the above technique using $C_2H_2$ as a precursor.

TABLE 2

| | Operation | Deposition | Etching | Ashing |
|---|---|---|---|---|
| Conditions | Time (s) | 3 | 9 | 15 |
| | Pressure (Torr) | 0.5 | 0.3 | 6 |
| | Temperature (° C.) | 450 | 450 | 450 |
| Deposition Precursor | $C_2H_2$ Flow (sccm) | 300 | 0 | 0 |
| Process Gas | $H_2$ Flow (sccm) | 200 | 400 | 9500 |
| Inert Carrier Gases | He Flow (sccm) | 0 | 0 | 0 |
| | $N_2$ Flow (sccm) | 0 | 0 | 0 |
| | Ar Flow (sccm) | 2000 | 5600 | 5000 |
| Plasma Excitation | HFRF Generator Setpoint (W) | 400 | 1000 | 3000 |
| | LFRF Generator Setpoint (W) | 2400 | 2000 | 0 |

In other implementations, the technique may be modified such that multiple consecutive deposition-ashing operations are followed by an etching operation; multiple such cycles may be performed during practice of the technique. Such a technique may be described by the following relation:

$$\{\{Deposition+Ashing\}_X+Etching\}_Y$$

Specifically, according to these implementations, the ashing operation/operations for a cycle is/are done prior to the etching operations for the cycle. The particular implementation used, i.e., the order of etch/ash or ash/etch, may be selected based on factors such as the aspect ratio of the gap and throughput considerations.

In yet other implementations, the technique may include performing $\{Deposition+Etching\}_X$ cycles without any intervening ashing cycles. In other such implementations, the technique may include performing $\{Deposition+Ashing\}_X$ cycles without any intervening etching cycles. In either case, the number of cycles that may be performed may be as low as single cycle, although multiple such cycles may typically be performed.

Turning back to the example of Table 2, in some implementations, the etching and ashing operations may be performed using the same gases at the same temperatures. However, various other parameters may be changed to switch from etching to ashing. For example, Ar and $H_2$ are used in both ashing and etching operations listed in Table 2, although the flow rate for $H_2$ is increased over 20-fold in the ashing operation as compared with the etching operation. The pressure within the processing area is, somewhat similarly, increased nearly 20-fold. Such changes, however, are relatively low-cost in terms of process duration since there is no need to switch between different process gases nor to perform any purge cycles. The other significant change between the etch operations and the ashing operations is that the LFRF power is turned off during the ashing operation and the HFRF power is tripled as compared to the etching operation.

In the etching operations, the application of significant LFRF power causes a large bias voltage to develop between the electrodes within the process chamber, drawing ions produced by a plasma generated by the application of HFRF power towards the wafer. The resulting ion bombardment of the wafer causes anisotropic material removal to occur largely due to momentum transfer.

During the ashing operations, the LFRF power is stopped, causing the large bias voltage to drop significantly (there is still, however, some residual bias voltage due to the presence of HFRF—this is typically about an order of magnitude or more lower than the bias voltage during LFRF operations). However, the HFRF power is increased significantly—in this case, triple the wattage of HFRF that was supplied during the etching operations. This causes an increase in the amount of process gas, e.g., $H_2$ or Ar, that is dissociated by the plasma generated by the HFRF electromagnetic field and that is then free to react with the carbon film on the wafer. Thus, the etching operations may be considered to be "high" ion sputtering regime operations with respect to the ashing operations since the etching operations are dominated by the momentum transfer from ion sputtering, whereas the ashing operations may be considered to be "low" ion sputtering regime operations since there is little or no momentum transfer material removal occurring.

For example, the bias voltage produced during the etching operation of Table 2, e.g., a high ion sputtering regime operation, by the 2000 W of LFRF power and 1000 W of HFRF power that is applied is approximately 480V, whereas the bias voltage produced during the ashing operation of Table 2, e.g., a low ion sputtering regime operation, by 3000 W of HFRF and 0 W of LFRF is approximately 35V. As can be seen, there is nearly an order of magnitude difference in bias voltage between the etching and ashing operations of Table 2.

Figure 3A:
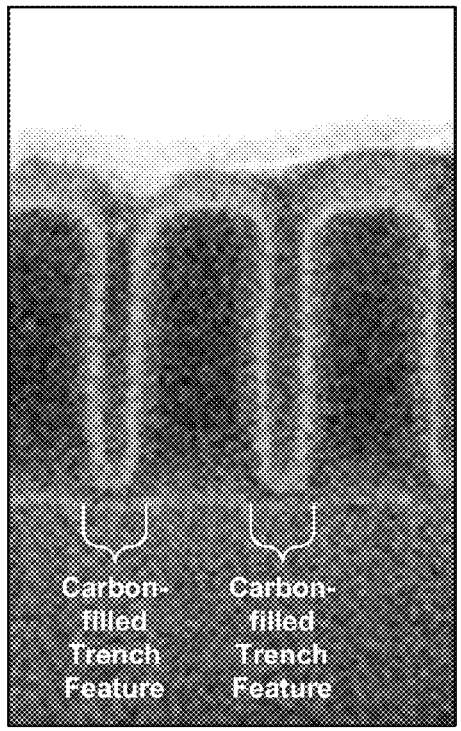
FIG. 3A is a cross-sectional image of a high-aspect-ratio gap feature filled using a technique as described herein.
Figure 3B:
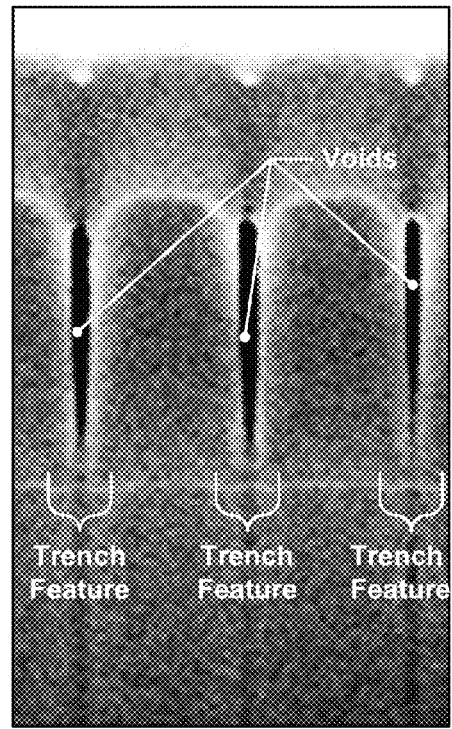
FIG. 3B is a cross-sectional image of the high-aspect-ratio gap feature of FIG. 3A filled using a deposition-only technique.
Figure 4A:
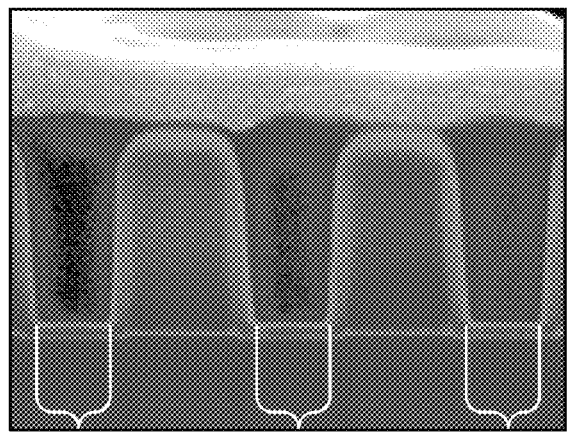
FIG. 4A is a cross-sectional image of a low-aspect-ratio gap feature filled using a technique as described herein.
Figure 4B:
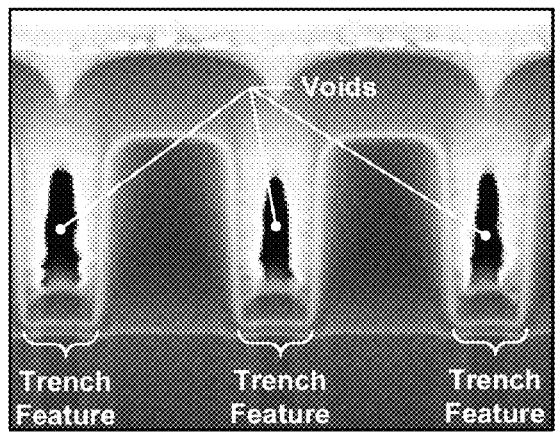
FIG. 4B is a cross-sectional image of the low-aspect-ratio gap feature of FIG. 4A filled using a deposition-only technique.

Focused ion beam (FIB)/scanning electron microscope (SEM) images were taken to compare gap-fill results achieved with two different aspect ratio trenches by a $\{\{Deposition+Etching\}_X+Ashing\}_Y$ technique in accordance with the present disclosure and with a PECVD deposition-only process for comparison. Referring to FIGS. 3A and 3B, which depict cross-sections of a 30 nm wide, 12:1 depth/width aspect ratio filled trench gap feature, and 4A and 4B, which depict a 140 nm wide, 2:1 depth/width aspect ratio filled trench gap feature, it can be clearly seen that the $\{\{Deposition+Etching\}_X+Ashing\}_Y$ technique, as evidenced by FIGS. 3A and 4A, provides superior performance to the deposition-only process, as evidenced by FIGS. 3B and 4B, for both high-aspect ratio, narrow-width trenches and low-aspect ratio, wider trenches. The fill-height was varied by using different Y values and by varying the etch time.

In each case, it can be clearly seen in the images that the PECVD deposition-only process resulted in the formation of significant voids in the trench fill for both trench geometries depicted, while both trench geometries were fully filled with carbon fill material using the $\{\{Deposition+Etching\}_X+Ashing\}_Y$ techniques outlined herein.

The present techniques may be implemented in a PECVD reactor. Such a reactor may take many different forms, and may be part of an apparatus that includes one or more chambers or "reactors" (sometimes including multiple stations) that may each house one or more wafers and may be configured to perform various wafer processing operations. The one or more chambers may maintain the wafer in a defined position or positions (with or without motion within that position, e.g. rotation, vibration, or other agitation). In one implementation, a wafer undergoing carbon film deposition may be transferred from one station to another within a reactor chamber during the process. In other implementations, the wafer may be transferred from chamber to chamber within the apparatus to perform different operations. The full film deposition may occur entirely at a single station or any fraction of the total film thickness may be deposited at any number of stations or chambers.

While in process, each wafer may be held in place by a pedestal, wafer chuck and/or other wafer-holding apparatus. For certain operations in which the wafer is to be heated, the apparatus may include a heater such as a heating plate. A Vector™ (e.g., C3 Vector) or Sequel™ (e.g., C2 Sequel) reactor, produced by Lam Research Corp. of Fremont, Calif., are both examples of suitable reactors that may be used to implement the techniques described herein.

Figure 5:
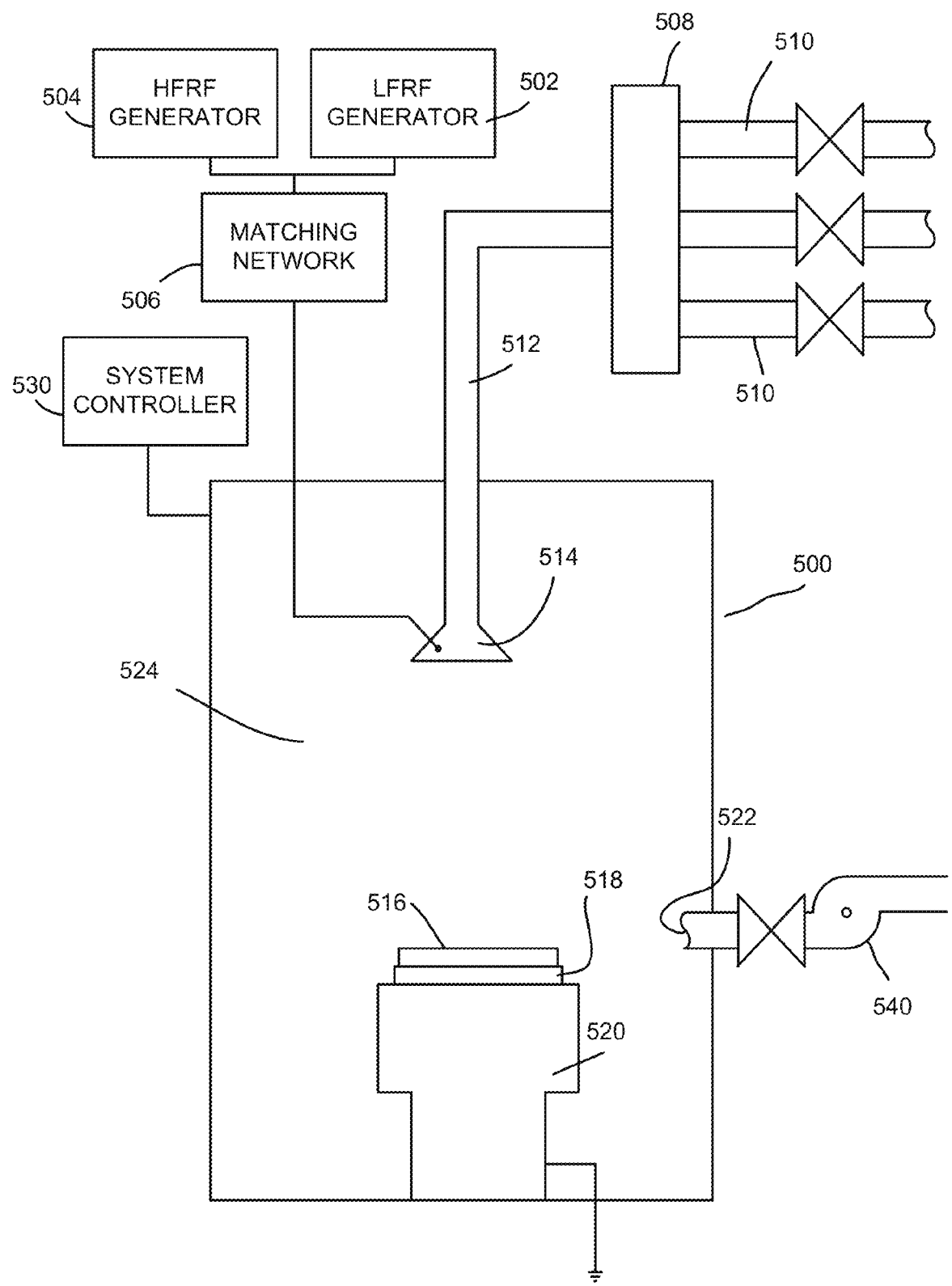
FIG. 5 depicts a simple block diagram showing various reactor components arranged for implementing the techniques described herein.

FIG. 5 provides a simple block diagram depicting various reactor components arranged for implementing the techniques described herein. As shown, a reactor 500 includes a process chamber 524 that encloses other components of the reactor and serves to contain a plasma generated by a capacitive-discharge type system including a showerhead 514 working in conjunction with a grounded heater block 520. A high-frequency RF generator 504 and a low-frequency RF generator 502 may be connected to a matching network 506 and to showerhead 514. The power and frequency supplied by matching network 506 may be sufficient to generate a plasma from process gas that is supplied to the process chamber 524, for example 100 to 5000 W of HFRF power and 100 to 5000 W of LFRF power total energy. In a typical process, the HFRF component may generally be between 5 to 60 MHz, e.g., 13.56 MHz. In operations wherein there is an LF component, the LF component may be from 100 kHz to 2 MHz, e.g., 430 kHz.

Within the reactor, a wafer pedestal 518 may support a substrate 516. The wafer pedestal 518 may include a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit chamber 524 via an outlet 522. A vacuum pump, e.g., a one or two stage mechanical dry pump and/or a turbomolecular pump 540, may typically be used to draw process gases out of the process chamber 524 and to maintain a suitably low pressure within the process chamber 524 by using a closed-loop-controlled flow restriction device, such as a throttle valve or a pendulum valve.

As discussed above, the techniques discussed herein may be implemented on a multi-station or single station tool. In specific implementations, a 300 mm Novellus Vector™ tool having a 4-station deposition scheme or a 200 mm Sequel™ tool having a 6-station deposition scheme may be used. In some implementations, the wafers may be indexed after every deposition and/or post-deposition plasma treatment until all the required depositions and treatments are completed, or multiple depositions and treatments may be conducted at a single station before indexing the wafer.

In some implementations, an apparatus may be provided that is configured to perform the techniques described herein. A suitable apparatus may include hardware for performing various process operations and a system controller having instructions for controlling process operations in accordance with the present disclosure. The system controller will typically include one or more memory devices and one or more processors communicatively connected with various process control equipment, e.g., valves, RF generators, wafer handling systems, etc., and configured to execute the instructions so that the apparatus will perform a technique in accordance with the present disclosure, e.g., a technique such as that provided in FIG. 1. Machine-readable media containing instructions for controlling process operations in accordance with the present disclosure may be coupled to the system controller. The controller may be communicatively connected with various hardware devices, e.g., mass flow controllers, valves, RF generators, vacuum pumps, etc. to facilitate control of the various process parameters that are associated with deposition, etch, and ashing operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck and/or susceptor position, and other parameters of a particular process performed by the reactor apparatus 500. The system control software may be configured in any suitable way. For example, various process tool component subroutines or control objects may be written to control operation of the process tool components necessary to carry out various process tool processes. The system control software may be coded in any suitable computer readable programming language.

The system controller may typically include one or more memory devices and one or more processors configured to execute the instructions so that the apparatus will perform a technique in accordance with the present disclosure. Machine-readable media containing instructions for controlling process operations in accordance with the present disclosure may be coupled to the system controller.

The method and apparatus described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. In one implementation, one or more gap features on a wafer are filled with a carbon film using a technique as described herein. The carbon film may then be used, for example, for one of the purposes described herein. Further, the implementation may include one or more steps (1)-(6) described above.

Techniques, apparatus, and systems for carbon gap-fill in semiconductor processing using a deposition-etch-ash process are provided. The method, apparatus and systems described may be usefully applied to achieve substantially void-free, high-aspect-ratio carbon gap-fill. In addition to yielding seamless gap fill with no void formation, the techniques, apparatuses, and systems such as described herein may also allow for the deposition of dense carbon materials demonstrating superior material properties, e.g., higher hardness and modulus, than spin on carbon film processes provide.

Although the foregoing concepts have been described in some detail for purposes of clarity of understanding, it will be apparent that certain changes and modifications may be practiced within the scope of this disclosure. It should be noted that there are many alternative ways of implementing the processes, systems, and apparatus of the present disclosure. Accordingly, the present implementations are to be considered as illustrative and not restrictive, and this disclosure is not to be limited to the details given herein.

What is claimed is:

1. A semiconductor processing tool comprising:
a process chamber;
one or more gas inlets into the process chamber and associated flow-control hardware;
a low-frequency radio-frequency (LFRF) generator;
a high-frequency radio-frequency (H FRF) generator; and
a controller having at least one processor and a memory, wherein:
the at least one processor and the memory are communicatively connected with one another,
the at least one processor is at least operatively connected with the flow-control hardware, the HFRF generator, and the LFRF generator, and
the memory stores computer-executable instructions for controlling the at least one processor to at least control the process chamber, the flow-control hardware, the HFRF generator, and the LFRF generator to:
a) perform a deposition process on receiving a substrate within the process chamber, the substrate having a top surface and at least one gap feature with a gap entry width where the at least one gap feature intersects the top surface;
b) perform a deposition process to deposit a carbon film layer on the substrate and on exposed surfaces of the at least one gap feature, wherein the deposition process is performed at least until the deposited carbon film layer causes the gap entry width to be reduced;
c) perform an anisotropic etch process on the substrate with a dominant anisotropic axis substantially perpendicular to the substrate at least until the gap entry width increases from the gap entry width at the conclusion of (b);
d) perform X additional cycles of (b) and (c), wherein X is a positive integer; and
e) perform an ashing process to remove localized build-up of carbon film on the top surface of the substrate adjacent to the at least one gap feature produced as a result of (b) through (d).

2. The semiconductor processing tool of claim 1, wherein the computer-executable instructions further include instructions for controlling the at least one processor to at least control the flow-control hardware, the HFRF generator, and the LFRF generator to f) perform Y additional cycles of (a) through (e), wherein Y is a positive integer.

3. The method of claim 2, wherein:
the at least one gap feature has a gap feature depth of ZÅ, and
Y is between $$\frac{Z}{75\text{Å}}$$

and $$\frac{Z}{40\text{Å}}.$$

4. The method of claim 2, wherein:
X is between about 1 and 100, and
Y is between about 2 and 1000.

5. The method of claim 2, wherein:
X is between about 2 and 20, and
Y is between about 10 to 100.

6. The method of claim 1, wherein:
the at least one gap feature has a depth-to-width aspect ratio of up to about 12:1, and
the gap entry width is between about 30 nm and about 140 nm.

7. The method of claim 1, wherein the deposition process is a plasma-enhanced chemical vapor deposition (PECVD) process.

8. The method of claim 7, wherein the PECVD process uses a $C_XH_Y$ precursor.

9. The method of claim 8, wherein the $C_XH_Y$ precursor is $C_2H_2$.

10. The method of claim 1, wherein the anisotropic etch process is a plasma etch process with a high ion sputtering regime as compared with the ashing process.

11. The method of claim 10, wherein the anisotropic etch process uses an etch chemistry that includes $H_2$ and Ar.

12. The method of claim 1, wherein the ashing process is performed under conditions that cause the ashing process to preferentially remove the localized build-up of carbon film on the top surface of the substrate adjacent to the at least one gap feature produced as a result of (b) through (d).

13. The method of claim 1, wherein (a) through (e) are performed in a single chamber without performing an intervening vacuum break.

14. The method of claim 1, wherein:
the deposition process:
lasts from between about 0.5 s to about 30 s,
is performed under pressure conditions of between about 0.025 Torr to about 8 Torr,
is performed at a temperature of between about 400 to about 500° C., includes providing $C_XH_Y$ gas to a reaction area above the substrate at a flow rate of between about 100 sccm to about 9500 sccm, includes providing $H_2$ gas to the reaction area at a flow rate of between about 100 sccm to about 9500 sccm, includes supplying high-frequency radio-frequency power of between about 100 W to about 3000 W, and includes supplying low-frequency radio-frequency power of between about 200 W to about 5000 W;

the anisotropic etch process:

lasts from between about 0.5 s to about 30 s, is performed under pressure conditions of between about 0.025 Torr to about 1 Torr, is performed at a temperature of between about 400 to about 500° C., includes providing $H_2$ gas to the reaction area at a flow rate of between about 100 sccm to about 2000 sccm, includes supplying high-frequency radio-frequency power of between about 100 W to about 1500 W, and includes supplying low-frequency radio-frequency power of between about 200 W to about 5000 W; and the ashing process:

lasts from between about 0.5 s to about 30 s, is performed under pressure conditions of between about 4 Torr to about 8 Torr, is performed at a temperature of between about 400 to about 500° C., includes providing $H_2$ gas to the reaction area at a flow rate of between about 5000 sccm to about 9500 sccm, and includes supplying high-frequency radio-frequency power of between about 1500 W to about 3000 W, wherein the flow rate of $C_XH_Y$ during the anisotropic etch process and the ashing process is at or about 0 sccm.

15. The method of claim 14, wherein at least one of the deposition process, the anisotropic etching process, and the ashing process further includes one or more operations selected from the group consisting of:

supplying He gas to the reaction area at a flow rate of up to about 9500 sccm, supplying $N_2$ gas to the reaction area at a flow rate of up to about 9500 sccm, and supplying Ar gas to the reaction area at a flow rate of up to about 9500 sccm.

16. The method of claim 14, wherein the ashing process further includes supplying low-frequency radio-frequency power of up to about 5000 W.

17. The method of claim 14, wherein the $C_XH_Y$ gas is $C_2H_2$.

18. The method of claim 14, wherein:

the deposition process:

lasts approximately 3 s, is performed under pressure conditions of approximately 0.5 Torr, is performed under temperature conditions of approximately 450° C., includes providing $C_XH_Y$ gas to a reaction area above the substrate at a flow rate of approximately 300 sccm, includes providing $H_2$ gas to the reaction area at a flow rate of approximately 200 sccm, includes providing Ar gas to the reaction area at a flow rate of approximately 2000 sccm, includes supplying high-frequency radio-frequency power of approximately 400 W, and includes supplying low-frequency radio-frequency power of approximately 2400 W;

the anisotropic etch process:

lasts approximately 9 s, is performed under pressure conditions of approximately 0.3 Torr, is performed under temperature conditions of approximately 450° C., includes providing $H_2$ gas to the reaction area at a flow rate of approximately 400 sccm, includes providing Ar gas to the reaction area at a flow rate of approximately 5600 sccm, includes supplying high-frequency radio-frequency power of approximately 1000 W, and includes supplying low-frequency radio-frequency power of approximately 2000 W; and the ashing process:

lasts approximately 15 s, is performed under pressure conditions of approximately 6 Torr, is performed under temperature conditions of approximately 450° C., includes providing Ar gas to the reaction area at a flow rate of approximately 5000 sccm, and includes supplying high-frequency radio-frequency power of approximately 3000 W.

19. A semiconductor processing tool comprising:

a process chamber;

one or more gas inlets into the process chamber and associated flow-control hardware;

a low-frequency radio-frequency (LFRF) generator;

a high-frequency radio-frequency (HFRF) generator; and a controller having at least one processor and a memory, wherein:

the at least one processor and the memory are communicatively connected with one another, the at least one processor is at least operatively connected with the flow-control hardware, the HFRF generator, and the LFRF generator, and the memory stores computer-executable instructions for controlling the at least one processor to at least control the flow-control hardware, the HFRF generator, and the LFRF generator to:

a) perform a deposition process on a substrate having a top surface and at least one gap feature with a gap entry width where the at least one gap feature intersects the top surface to deposit a carbon film layer on the substrate and on exposed surfaces of the at least one gap feature, wherein the deposition process is performed at least until the deposited carbon film layer causes the gap entry width to be reduced;

b) perform an anisotropic etch process on the substrate with a dominant anisotropic axis substantially perpendicular to the substrate at least until the gap entry width increases from the gap entry width at the conclusion of (a);

c) perform X additional cycles of (a) and (b), wherein X is a positive integer; and d) perform an ashing process to remove localized build-up of carbon film on the top surface of the substrate adjacent to the at least one gap feature produced as a result of (a) through (c).

20. The semiconductor processing tool of claim 19, wherein the computer-executable instructions further include instructions for controlling the at least one processor to at least control the flow-control hardware, the HFRF generator, and the LFRF generator to e) perform Y additional cycles of (a) through (d), wherein Y is a positive integer.

* * * * *

UNITED STATES PATENT AND TRADEMARK OFFICE
CERTIFICATE OF CORRECTION

PATENT NO. : 9,023,731 B2
APPLICATION NO. : 13/896729
DATED : May 5, 2015
INVENTOR(S) : Chunhai Ji et al.

It is certified that error appears in the above-identified patent and that said Letters Patent is hereby corrected as shown below:

In the claims,

The entire text of claim 1 (column 13, line 39, through column 14, line 9) is to be canceled and replaced with:
--1. A method comprising:
 a) providing a substrate in a semiconductor process chamber, the substrate having a top surface and at least one gap feature with a gap entry width where the at least one gap feature intersects the top surface;
 b) performing a deposition process to deposit a carbon film layer on the substrate and on exposed surfaces of the at least one gap feature, wherein the deposition process is performed at least until the deposited carbon film layer causes the gap entry width to be reduced;
 c) performing an anisotropic etch process on the substrate with a dominant anisotropic axis substantially perpendicular to the substrate at least until the gap entry width increases from the gap entry width at the conclusion of (b);
 d) performing X additional cycles of (b) and (c), wherein X is a positive integer; and
 e) performing an ashing process to remove localized build-up of carbon film on the top surface of the substrate adjacent to the at least one gap feature produced as a result of (b) through (d).--.

The entire text of claim 2 (column 14, lines 10-15) is to be canceled and replaced with:
--2. The method of claim 1, further comprising:
 f) performing Y additional cycles of (a) through (e), wherein Y is a positive integer.--.

In column 14, line 17, the text reading "ZA" should be changed to "--ZÅ--".

In column 16, line 39 (claim 19), the text reading "the flow-control hardware" should be changed to "--the process chamber, the flow-control hardware--".

Signed and Sealed this
Twenty-second Day of March, 2016

Michelle K. Lee
*Director of the United States Patent and Trademark Office*

CERTIFICATE OF CORRECTION (continued)
U.S. Pat. No. 9,023,731 B2

In column 16, line 41 (claim 19), the text reading "perform a deposition process on a substrate" should be changed to "--receive a substrate within the process chamber, the substrate--".

In column 16, line 44 (claim 19), the text --; b) perform a deposition process-- should be inserted after the word "surface"; all of this text except for the leading ";" should start on a new line.

In column 16, line 49 (claim 19), the text "b)" should be replaced with "--c)--".

In column 16, line 53 (claim 19), the text "(a)" should be replaced with "--(b)--".

In column 16, line 54 (claim 19), the text "(a) and (b)" should be replaced with "--(b) and (c)--".

In column 16, line 54 (claim 19), the text "c)" should be replaced with "--d)--".

In column 16, line 56 (claim 19), the text "d)" should be replaced with "--e)--".

In column 16, line 59 (claim 19), the text "(a) through (c)" should be replaced with "--(b) through (d)--".

In column 16, line 65 (claim 20), the text "(a) through (d)" should be replaced with "--(b) through (e)--".